(12) United States Patent
Yoshihara et al.

(10) Patent No.: US 9,080,814 B2
(45) Date of Patent: Jul. 14, 2015

(54) CONTINUOUS CASTING METHOD OF SILICON INGOT

(71) Applicant: SUMCO CORPORATION, Tokyo (JP)

(72) Inventors: Mitsuo Yoshihara, Tokyo (JP); Koichi Maegawa, Tokyo (JP); Shinya Fukushima, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 211 days.

(21) Appl. No.: 13/793,115

(22) Filed: Mar. 11, 2013

(65) Prior Publication Data

US 2013/0247618 A1    Sep. 26, 2013

(30) Foreign Application Priority Data

Sep. 2, 2010    (JP) ................... 2010-196462

(51) Int. Cl.
| | |
|---|---|
| *F27B 14/10* | (2006.01) |
| *F27B 14/06* | (2006.01) |
| *C30B 11/00* | (2006.01) |
| *F27B 14/08* | (2006.01) |
| *F27D 7/06* | (2006.01) |
| *C30B 29/06* | (2006.01) |

(52) U.S. Cl.
CPC .............. *F27B 14/10* (2013.01); *C30B 11/001* (2013.01); *C30B 11/002* (2013.01); *C30B 29/06* (2013.01); *F27B 14/061* (2013.01); *F27B 14/0806* (2013.01); *F27D 7/06* (2013.01)

(58) Field of Classification Search
CPC .... F27B 14/10; F27B 14/061; F27B 14/0806; C30B 29/06; C30B 11/001; C30B 11/002; F27D 7/06

USPC .............................................. 65/90
See application file for complete search history.

(56) References Cited

U.S. PATENT DOCUMENTS

2010/0243193 A1*    9/2010    Jeong et al. ................... 164/427

FOREIGN PATENT DOCUMENTS

| JP | 10-101319 | 4/1998 | |
|---|---|---|---|
| JP | 2002053921 A * | 2/2002 | ................ C22C 9/06 |

OTHER PUBLICATIONS

Revue Phys. Appl. 22 (1987) J. Fally, E. Fabre, B. Chabot, p. 532, Fig. 3.
Photovoltaic Engineering, Koichi Yamada and Hiroshi Komiyama, Nikkei BP (first published on Oct. 7, 2002), p. 85, Fig. 2-4-12.

* cited by examiner

*Primary Examiner* — Queenie Dehghan
(74) *Attorney, Agent, or Firm* — Clark & Brody

(57) ABSTRACT

Provided is a continuous casting method of a silicon ingot for continuously casting the silicon ingot by arranging, inside an induction coil, a bottomless cold crucible having a part along an axial direction that is circumferentially divided into a plurality of strip elements, forming molten silicon inside the cold crucible through electromagnetic induction heating by the induction coil, and solidifying the molten silicon while pulling it down from the cold crucible, wherein as the cold crucible, used is a cold crucible with Ni—B alloy plating on a portion in the inner surface thereof that faces the outer side surface of the molten silicon and the outer surface of the silicon ingot. The method can reduce the damage to the inner surface of the cold crucible, in addition to the contamination of cast ingots with impurities.

1 Claim, 4 Drawing Sheets

FIG. 5A
FIG. 5B
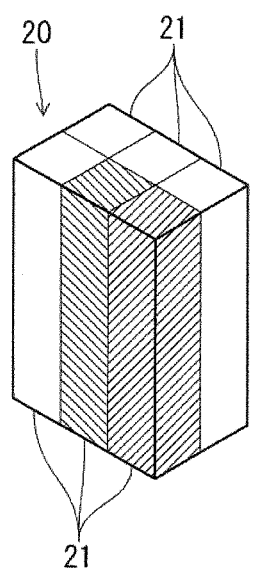
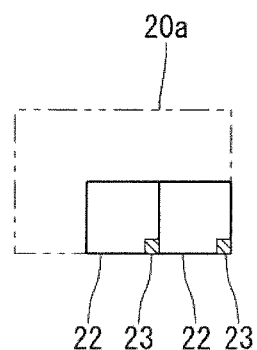

CONTINUOUS CASTING METHOD OF SILICON INGOT

TECHNICAL FIELD

The present invention relates to a continuous casting method of a silicon ingot for use in a solar battery substrate. More specifically, the present invention relates to a continuous casting method of a silicon ingot, capable of mitigating damage to the inner surface of a bottomless cold crucible, while capable of suppressing contamination of cast ingot with impurities.

BACKGROUND ART

In recent years, problems such as global warming by $CO_2$ emission and deletion of energy resources are becoming increasingly serious, and as one of countermeasures thereto, photovoltaic generation using energy from the inexhaustibly shining sunlight is drawing attention. The photovoltaic generation is a power generation system in which the energy from sunlight is directly converted to electric power by use of a solar battery, and a polycrystalline silicon wafer is predominantly used for a substrate for the solar battery.

A polycrystalline silicon wafer for a solar battery uses a unidirectionally solidified silicon ingot as starting material, and is produced by slicing the ingot. Therefore, in order to get the solar batteries to be in widespread use, the cost of the silicon wafer has to be reduced while securing the quality thereof. Further, as a stage prior to the production of the silicon wafer by slicing, producing a high-quality silicon ingot with low cost is demanded.

In the quality demand for polycrystalline silicon ingot, the concentration of impurities contained in the silicon ingot is particularly important. This is because contamination of a polycrystalline silicon wafer, as being cut from the silicon ingot, with impurities such as Mo, Fe and Cu causes, when applied to a solar battery, deterioration of photoelectric conversion efficiency. For example, a relationship between impurity concentration and photoelectric conversion efficiency in a polycrystalline silicon wafer is shown in Non-Patent Literature 1.

FIG. 2 is a view showing a relationship between impurity concentration and relative conversion efficiency in a polycrystalline silicon wafer. FIG. 2 is a citation from FIG. 3 given in Non-Patent Literature 1, p. 532. FIG. 2 indicates a relationship between concentrations of Mo, Fe, Cu, C, O and Al, which are impurities, and relative conversion efficiency in a solar battery using a P-type polycrystalline silicon wafer. It can be confirmed from FIG. 2 that the relative conversion efficiency is deteriorated when the concentration of each impurity exceeds a specific concentration.

In Non-Patent Literature 2, a relationship between impurity concentration and photoelectric conversion efficiency is shown although it relates to a monocrystalline silicon wafer for a solar battery.

FIG. 3 is a view showing a relationship between impurity concentration and relative conversion efficiency in a monocrystalline silicon wafer. FIG. 3 is a citation from FIG. 2-4-12 given in Non-Patent Literature 2, p. 105. FIG. 3 indicates a relationship between concentrations of Ta, Mo, Nd, Zr, W, Ti, V, Cr, Mn, Fe, Co, Al, Ni, Cu and P, which are impurities, and relative conversion efficiency in a solar battery using a P-type monocrystalline silicon wafer. It can be confirmed from FIG. 3 that the relative conversion efficiency is deteriorated when the concentration of each impurity exceeds a specific concentration.

Therefore, it is recommended for a polycrystalline silicon wafer for a solar battery to reduce the contamination with impurities as much as possible. Thus, it is demanded for a silicon ingot that is used as the starting material of the polycrystalline silicon wafer to reduce the contamination with impurities as much as possible.

As a method capable of responding to such demands for cost and quality, an EMC (Electromagnetic Casting) process that is a continuous casting method using electromagnetic induction is put into practical use.

FIG. 4 is a schematic view showing a configuration of a continuous casting apparatus (hereinafter simply referred also to as "EMC furnace") which is used in the conventional EMC process. As shown in FIG. 4, the EMC furnace is provided with a chamber 1. The chamber 1 is a water-cooled container having a double-walled structure, which is configured so that the inside is isolated from the outside air and maintained in an inert gas atmosphere suitable for casting. A raw material supply device, not shown, is connected to the upper wall of the chamber 1 through an openable and closable shutter 2. The chamber 1 includes an inert gas inlet 5 provided at an upper portion of a side wall and an outlet 6 provided at a lower portion of the side wall.

A bottomless cold crucible 7, an induction coil 8 and an after-heater 9 are disposed inside the chamber 1. The bottomless cold crucible 7 functions not only as a melting container but also as a casting mold. The cold crucible 7 is composed of a square cylinder made of metal excellent in heat conductivity and electric conductivity (e.g., copper), and suspended within the chamber 1. The cold crucible 7 has a part along an axial direction that is circumferentially divided into a plurality of sections as being strip elements. The cold crucible 7 is forcedly cooled by cooling water circulated inside.

The induction coil 8 is provided concentrically with the cold crucible 7 so as to surround the cold crucible 7, and is connected to a power-supply unit, not shown. A plurality of after-heaters 9 are continuously provided below the cold crucible 7 in a concentric manner with the cold crucible 7. An ingot 3 being pulled down from the cold crucible 7 is heated by the after-heater 9, and cooled to room temperature over time while causing an appropriate temperature gradient therein along an axial direction.

In the inside of the chamber 1, a raw material inlet tube 11 is attached below the shutter 2 connected to the raw material supply device. Granular and/or lump-like silicon raw materials 12 are supplied from the raw material supply device to the raw material inlet tube 11 in accordance with the opening and closing of the shutter 2, and charged into the cold crucible 7.

An outlet port 4 for pulling the ingot 3 below the after-heaters 9 is provided on the bottom wall of the chamber 1, and the outlet port 4 is sealed with gas. The ingot 3 is pulled down while being supported by a support stand 15 that can be lowered through the outlet port 4.

A plasma torch 14 is provided just above the cold crucible 7 so as to be movable up and down. The plasma torch 14 is connected to one of poles of a plasma power-supply unit, not shown, the other pole thereof being connected to the ingot 3 side. The plasma torch 14 is used in a state where it is lowered and inserted to the cold crucible 7.

In the EMC process using such an EMC furnace, the silicon raw materials 12 are charged in the bottomless cold crucible 7, and the lowered plasma torch 14 is electrified while applying an AC current to the induction coil 8. At that time, since the strip elements constituting the cold crucible 7 are electrically separated from each other, eddy current is generated within each element, accompanied by the electromagnetic induction by the induction coil 8, and the eddy current on the inner wall of the cold crucible 7 generates a magnetic field within the cold crucible 7. The silicon raw materials inside the cold crucible 7 are thus molten through electromagnetic induction heating to form molten silicon 13. Further, plasma arc is generated between the plasma torch 14 and the silicon raw materials and also between the plasma torch 14 and the molten silicon 13. The silicon raw materials are heated and molten also by the Joule heat of the plasma arc. The molten silicon 13 is thus efficiently formed while reducing the load of the electromagnetic induction heating.

The molten silicon 13 receives a force (pinching force, refer to solid arrows in FIG. 4) in the inward normal direction of the outer side surface 13a of the molten silicon by an interaction between the magnetic field associated with the eddy current on the inner wall 7a of the cold crucible and the current generated on the side surface of the molten silicon 13. Therefore, the inner surface 7a of the cold crucible and the outer side surface 13a of the molten silicon are kept in a non-contact state.

When the support stand 15 supporting the molten silicon 13 is gradually lowered while the silicon raw materials 12 being melted inside the bottomless cold crucible 7, the induction magnetic field becomes small with a distance from the lower end of the induction coil 8 increasing. Due to the resulting reduction in heat value and pinching force and the cooling from the cold crucible 7, solidification progresses from the outer side surface 13a of the molten silicon and the outer surface 3a of the ingot. The silicon raw materials 12 are continuously charged in association with the lowering of the support stand 15 to continue the melting and solidification, whereby the molten silicon 13 is solidified unidirectionally, and the ingot 3 can be thus continuously casted.

According to such an EMC process, the contact of the outer side surface 13a of the molten silicon with the inner surface 7a of the bottomless cold crucible is significantly reduced. Therefore, the contamination with impurities from the cold crucible 7 which is associated with this contact is mitigated, and a high-quality ingot 3 can be obtained. Furthermore, a unidirectionally-solidified ingot 3 can be inexpensively produced owing to the continuous casting.

However, in the continuous casting of silicon ingot by the EMC process, the gap between the cold crucible and the ingot is very small such that the dimension of cast ingot is substantially equal to the inner surface dimension of the cold crucible in a cross section perpendicular to the pull-down axis. Therefore, the outer surface of the ingot supported on the support stand can locally contact the inner surface of the cold crucible due to the accuracy of a lifting device for pulling down the support stand, causing adhesion of impurities. In this case, the adhered impurities diffuse from the outer surface of the ingot to the inside thereof, in the cooling step using the after-heater, and contaminate the ingot.

Further, when the ingot as being cast locally contacts the cold crucible, the inner surface of the cold crucible is damaged. This also causes reduction in the number of ingots that can be continuously cast with a single cold crucible, or reduction in life of the cold crucible.

With respect to this problem in which the local contact of the ingot as being cast with the cold crucible causes the damage to the cold crucible in addition to the contamination of the ingot with impurities, various proposals are made in the past, including, for example, Patent Literature 1. In Patent Literature 1, a continuous casting method of an ingot using a cold crucible with silicon coating being applied to the inner surface thereof is proposed. According to Patent Literature 1, the silicon coating on the inner surface of the cold crucible allows reduction in the damage to the cold crucible in addition to reduction in the contamination of the ingot with impurities.

However, during the continuous casting of a silicon ingot, the silicon coating applied to the inner surface of the cold crucible reduces the pinching force acting onto molten silicon and further reaches high temperature by the surface skin effect of induction heating. Therefore, the phenomenon in which the molten silicon locally contacts the silicon coating frequently occurs, and the silicon coating is, upon contact, fused to the molten silicon. As a result, the silicon coating applied to the inner surface of the cold crucible is apt to be partially peeled off.

When a silicon-coated cold crucible is used for continuous casting of a plurality of ingots, in the third cycle/operation onwards in continuous casting, the cast ingot can be contaminated with impurities due to the contact with the inner surface of the cold crucible which is exposed by the peel-off of the silicon coating. Therefore, further reduction in the contamination of the ingot with impurities from the cold crucible and also further reduction in the damage to the cold crucible are demanded for the conventional continuous casting method of the silicon ingot.

SUMMARY OF THE INVENTION

Technical Problem

The continuous casting method of a silicon ingot by the EMC process has, as described above, the problem in which local contact of the ingot as being cast with the cold crucible causes damage to the cold crucible in addition to contamination of ingot with impurities. In the above-mentioned continuous casting method of a silicon ingot proposed in Patent Literature 1, the silicon coating applied to the inner surface of the cold crucible is apt to be partially peeled off. Therefore, when this cold crucible is used for continuous casting of a plurality of ingots, the ingot as being cast can be contaminated with impurities due to the contact with the inner surface of the cold crucible which is exposed by the peel-off of the silicon coating.

In view of these circumstances, the present invention has an object to provide a continuous casting method of a silicon ingot, capable of reducing the contamination of cast ingot with impurities and the damage to the inner surface of a cold crucible, both of which are attributed to local contact of an ingot as being casted with the cold crucible.

Solution to Problem

As a result of the earnest studies through various tests for attaining the above-mentioned object, the present inventors obtained the following knowledge. Namely, in continuous casting of a silicon ingot by the EMC process, a cold crucible having Ni—B alloy plating on the inner surface thereof is used, whereby the damage to the inner surface of the cold crucible in addition to the contamination of cast ingot with impurities can be reduced.

The present invention has been accomplished based on the above-mentioned knowledge, and the summary thereof consists in the following continuous casting method of a silicon ingot.

A continuous casting method of a silicon ingot of the present invention is a method for continuously casting a silicon ingot by arranging, inside an induction coil, a bottomless cold crucible having a part along an axial direction that is circumferentially divided into a plurality of strip elements, forming molten silicon inside the cold crucible through electromagnetic induction heating by the induction coil, and solidifying the molten silicon while pulling it down from the cold crucible, wherein as the cold crucible, used is a cold crucible having Ni—B alloy plating on a portion in the inner surface thereof that faces the outer side surface of the molten silicon and the outer surface of the silicon ingot.

Advantageous Effects of Invention

In the continuous casting method of a silicon ingot of the present invention, since the cold crucible with Ni—B alloy plating on the inner surface is used, the contamination of cast ingot with impurities and the damage to the inner surface of the cold crucible, both of which result from local contact of the ingot as being casted with the cold crucible, can be reduced.

BRIEF DESCRIPTION OF THE DRAWINGS

FIGS. 5(A) and (B) are schematic views showing test pieces obtained from a silicon ingot, wherein FIG. 5(A) shows positions of the silicon ingot to be divided, and FIG. 5(B) shows the positions of the test pieces cut from sample sheets.

DETAILED DESCRIPTION OF THE PREFERRED EMBODIMENTS

The continuous casting method of a silicon ingot of the present invention will be described with reference to the drawings.

Figure 1:
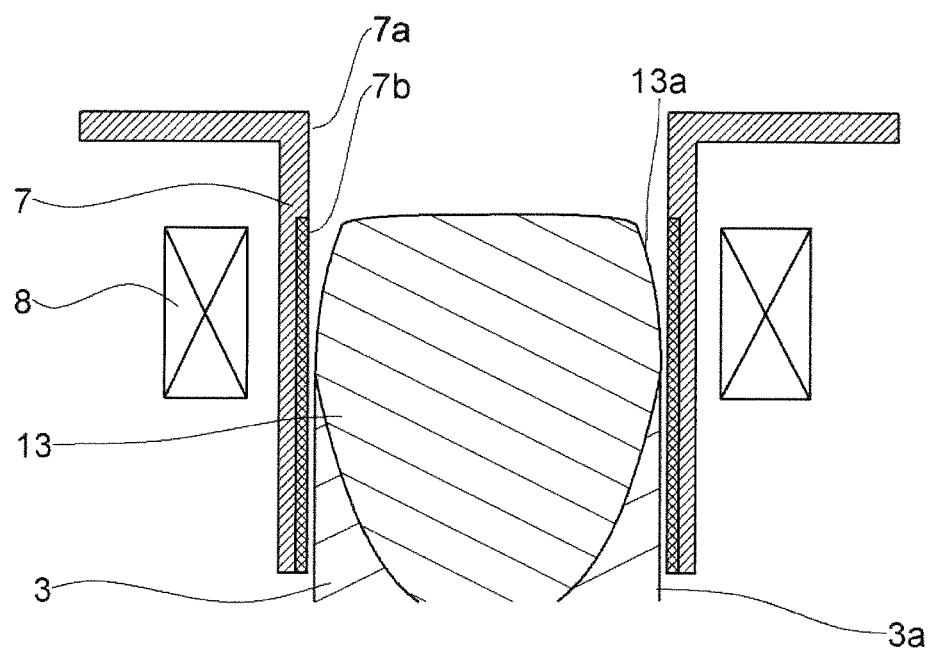
FIG. 1 is a schematic view for illustrating a continuous casting method of a silicon ingot of the present invention.
Figure 2:
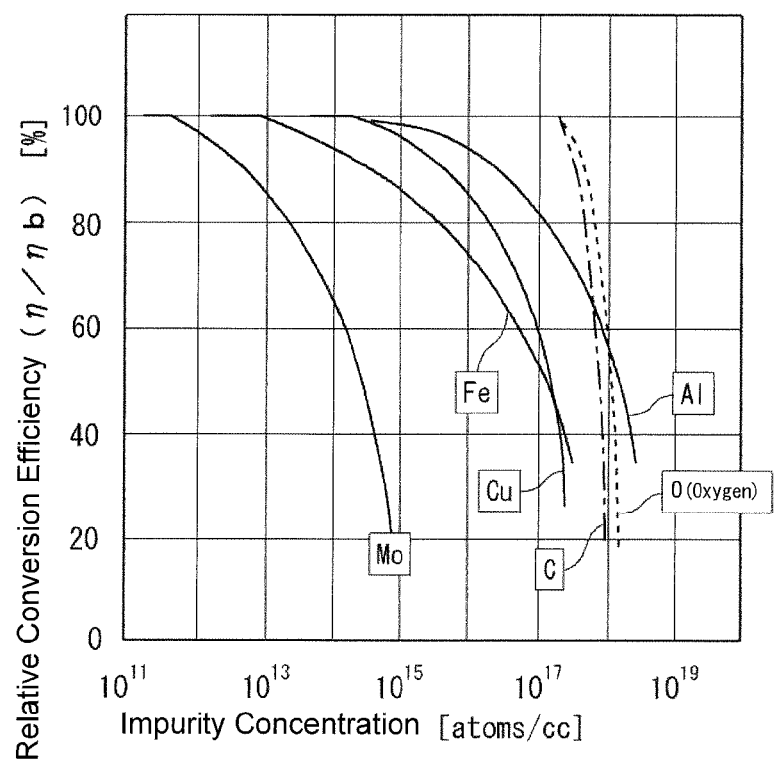
FIG. 2 is a view showing a relationship between impurity concentration and relative conversion efficiency in a polycrystalline silicon wafer.

FIG. 1 is a schematic view for illustrating the continuous casting method of a silicon ingot of the present invention. In FIG. 1, a bottomless cold crucible 7 and an induction coil 8 of an EMC furnace, molten silicon 13, and an ingot 3 being casted are shown. In FIG. 1, a portion 7b to be plated with Ni—B alloy in the inner surface of the cold crucible is schematically shown by cross-hatching.

The continuous casting method of a silicon ingot of the present invention is a method for continuously casting a silicon ingot by arranging, inside the induction coil 8, the bottomless cold crucible 7 having a part along an axial direction that is circumferentially divided into a plurality of strip elements, forming the molten silicon 13 inside the cold crucible 7 through electromagnetic induction heating by the induction coil 8, and solidifying the molten silicon while pulling it down from the cold crucible. In such a continuous casting method of a silicon ingot, as the cold crucible 7, used is a cold crucible having Ni—B alloy plating on the portion 7b in the inner surface thereof that faces the outer side surface 13a of the molten silicon and the outer surface 3a of the silicon ingot.

The Ni—B alloy plating on the inner surface of the cold crucible has a risk such that the ingot as being cast may contact the inner surface plated with Ni—B alloy of the cold crucible, causing contamination of cast ingot with Ni and B. The Ni—B alloy plating is higher in hardness and melting point than copper which is frequently used for the cold crucible. Therefore, if the ingot as being cast locally contacts the inner surface of the Ni—B alloy-plated cold crucible, the Ni—B alloy plating is hardly adhered to the outer surface of the ingot.

As a result, as shown in examples which will be described later, the concentration of Ni in cast ingot is substantially equal to that of an ingot cast by the conventional method, and the risk of the contamination of ingot with Ni can be dispelled. Further, since B is an element to be added as dopant, the effect of the concentration of B on photoelectric conversion efficiency in a wafer cut from a cast ingot is small, compared with impurities. Thus, even if the B concentration is slightly increased in the cast ingot, the qualities of the cast ingot and the wafer cut therefrom can be kept at the same level.

As described above, the Ni—B alloy plating is higher in hardness and melting point than the copper as being frequently used for the cold crucible. Therefore, the inner surface of the cold crucible is plated with Ni—B alloy, whereby the damage to the inner surface of the cold crucible can be reduced upon local contact of the ingot as being cast with the Ni—B alloy-plated inner surface of the cold crucible. Consequently, the continuous casting method of a silicon ingot of the present invention can increase the number of ingots that can be cast with one cold crucible, namely, can extend the life of the cold crucible.

Further, since the Ni—B plating is excellent in adhesivity to the cold crucible, compared with the silicon coating, the peel-off of the Ni—B alloy plating on the inner surface of the cold crucible can be mitigated. Therefore, in the continuous casting method of a silicon ingot of the present invention, as the Ni—B alloy-plated cold crucible is used in continuous casting of a plurality of ingots, the ingot as being cast can be prevented from being contaminated with impurities through the contact with the exposed inner surface of the cold crucible.

The outer side surface of the molten silicon or the outer surface of the ingot can locally contact the inner surface of the cold crucible since the gap between them is very small as mentioned above. The continuous casting of a silicon ingot is generally performed while adjusting the charging amount of silicon raw materials or the like so that the top surface of molten silicon is located at a predetermined depth below the upper surface of the cold crucible. Therefore, the portion extending from the upper surface to the predetermined depth below in the inner surface of the cold crucible is less likely to contact the molten silicon or ingot.

Accordingly, in the continuous casting method of a silicon ingot of the present invention, as shown in FIG. 1, the Ni—B plating is applied to the portion 7b, in the inner surface 7a of the cold crucible, that faces the outer side surface 13a of the molten silicon and the outer surface 3a of the silicon ingot. The continuous casting method of a silicon ingot of the present invention never precludes that the Ni—B alloy plating is applied to the whole inner surface of the cold crucible.

The film thickness of the Ni—B alloy plating on the inner surface of the cold crucible is preferably 0.1 to 2.0 mm. When the film thickness of the Ni—B alloy plating is less than 0.1 mm, the inner surface of the cold crucible may be exposed due to damage to the Ni—B alloy plating, and can contact and contaminate the ingot as being cast. On the other hand, it is difficult to apply the Ni—B alloy plating to the inner surface of the cold crucible in a film thickness exceeding 2.0 mm, and the cost required for the Ni—B alloy plating is increased to deteriorate the production yield.

EXAMPLES

Figure 4:
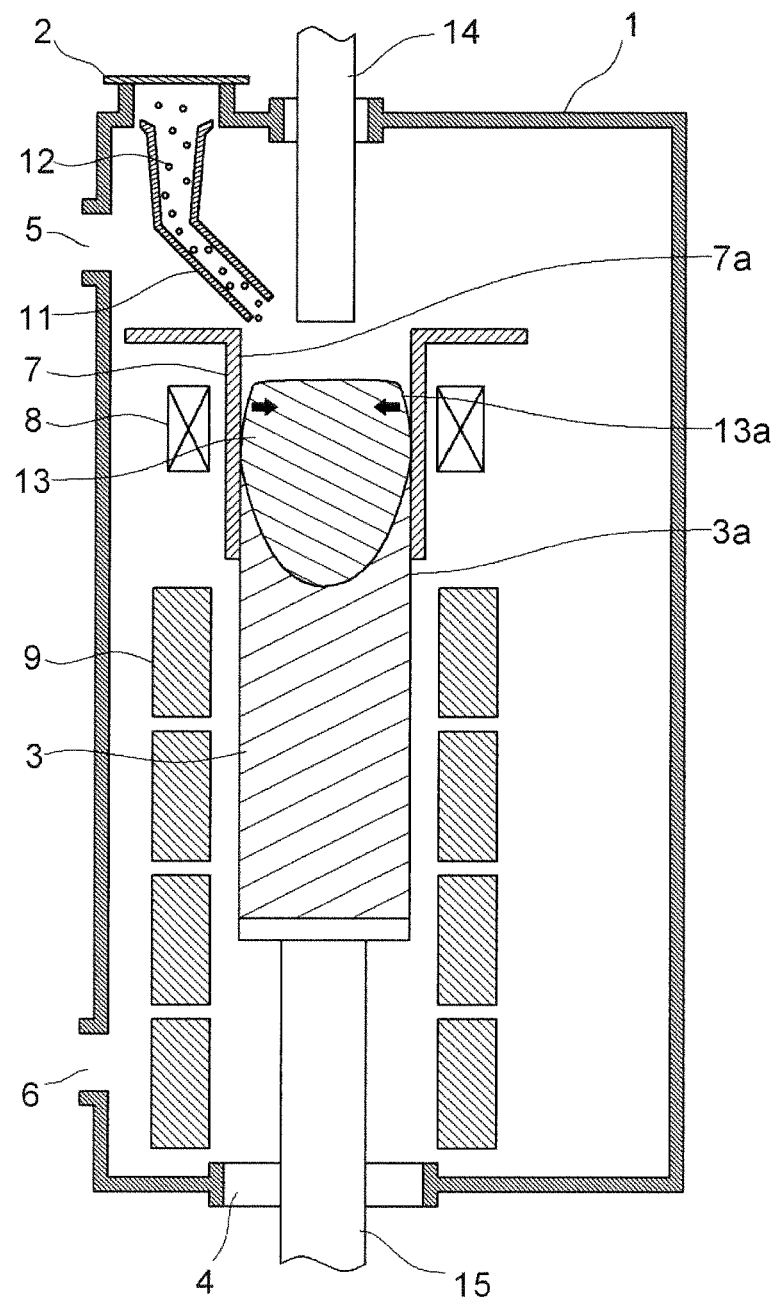
FIG. 4 is a schematic view showing a configuration of a continuous casting apparatus used for the conventional EMC process.

To confirm the effects of the continuous casting method of a silicon ingot of the present invention, the following tests were carried out.
[Test Conditions]
In these tests, using the continuous casting apparatus shown in FIG. 4, continuous casting of a silicon ingot was performed by the EMC process. As the cold crucible 7, as shown in FIG. 1, used was a copper-made cold crucible with Ni—B alloy plating on the portion 7b, in the inner surface thereof, that faces the outer side surface 13a of the molten silicon and the outer surface 3a of the silicon ingot. The film thickness of the Ni—B plating on the inner surface of the cold crucible was 0.8 mm. As the size of the ingot, the dimension of a cross section vertical to the pull-down axis is set so as to be capable of cutting two square wafers longitudinally and three square wafers laterally, and the pull-down length was set to 7,000 mm.

In Comparative Example 1, a copper-made cold crucible without coating or plating on the inner surface was used. In Comparative Example 2, a copper-made cold crucible with silicon coating 0.8 mm in thickness on the inner surface was used. The cold crucible used in each of Inventive Example and Comparative Examples had a shape such that a part thereof is circumferentially divided into a plurality of strip elements while leaving an upper portion thereof as it is, with the gap between adjacent stripe elements being 0.3 mm.

In both Inventive Example and Comparative Examples, the pull-down rate of the silicon ingot was 1.6 mm/min, the average frequency of the induction coil was 30 kHz, and the power of the induction coil was 350 kW. The average frequency of the induction coil is obtained by measuring and outputting frequencies of the induction coil during continuous casting of a single ingot, followed by averaging.

In both Inventive Examples and Comparative Examples, a plurality of ingots were continuously cast using a single cold crucible, respectively. Upon each completion of continuous casting of a single ingot, the inner surface property of the cold crucible was visually observed, and the gap between adjacent elements was measured. Using the same cold crucible in continuous casting of the ingot was terminated when some portion of all the element-to-element gaps of the cooling crucible reached 1.0 mm or more.

In both Inventive Examples and Comparative Examples, for evaluation of the contamination of the cast ingot with impurities, Cu and Ni concentrations in the outer surface layer of cast ingot was measured for all ingots. In this measurement, each cast ingot was cut at the position of 10 mm from the outer surface to remove the cast surface, the ingot was divided into divisio-ingots, a sample sheet was obtained from a predetermined divisio-ingot thereof, and a test piece was cut from the sample sheet.

FIGS. 5(A) and (B) are schematic views showing test pieces obtained from a silicon ingot, in which FIG. 5(A) shows positions of the silicon ingot to be divided, and FIG. 5(B) shows the positions of the test pieces cut from sample sheets. As shown in FIG. 5(A), an ingot 20 with the cast surface being removed was divided into two equals in a narrow side surface and into three equals in a broad side surface, in parallel to the pull-down axis, to form six divisio-ingots 21 each having a longitudinal direction in parallel to the pull-down axial direction. In this example, two divisio-ingots 21 at shaded positions were used, and sample sheets of 2 mm in thickness were collected from positions of 1,000 mm, 3,000 mm and 5,000 mm from the bottom side respectively.

In FIG. 5(B), two sample sheets 22 collected from two divisio-ingots and from which portions 23 in the sample sheets test pieces are cut are shown (hatched portions). For indicating the positions of the two sample sheets 22 collected from the two divisio-ingots in the prior ingot, the outer surface 20a of the prior ingot is shown by the two-dot chain line. In each of the sample sheets 22 collected from the two divisio-ingots 21, as shown in FIG. 5(B), a 20 mm-square test piece 23 was cut from the outer periphery portion of the sample sheet that is the outer surface 20a side of the prior ingot. With respect to each of the cut test piece 23, complete fusion analysis was performed to measure Cu and Ni concentrations, and the measured values were regarded as Cu and Ni concentrations in the outer surface layer of the prior cast ingot.

In Table 1, the treatment applied to the inner surface of the cold crucible, the number of cast ingots, and maximum values of the Cu and Ni concentrations in the outer surface layer of the cast ingot are shown. The Cu and Ni concentrations shown in Table 1 are relative values with the value of Comparative Example 1 being set as a reference (1.0). The maximum value of each of the Cu and Ni concentrations in the outer surface layer of the cast ingot is the maximum value of the measurement values in a plurality of resulting test pieces.

TABLE 1

| Classification | Treatment applied to inner surface of cold crucible | Number of cast ingots | Maximum value of impurity concentrations in outer surface layer of cast ingot | |
| --- | --- | --- | --- | --- |
| | | | Cu concentration | Ni concentration |
| Comparative Example 1 | Non | 3 | 1.0 | 1.0 |
| Comparative Example 2 | Silicon coating | 6 | 0.4 | 1.0 |
| Inventive Example 1 | Ni—B plating | 20 | Less than 0.1 | 1.0 |

[Test Result]
As shown in Table 1, in Comparative Example 1 using the copper-made cold crucible without surface treatment on the inner surface, the gap between adjacent strip elements partly became 1.0 mm or more due to the wear of the cold crucible upon completion of continuous casting of three ingots.

In Comparative Example 2 using the copper-made cold crucible with silicon coating on the inner surface, partial peel-off of the silicon coating was discerned upon completion of continuous casting of three ingots, and upon completion of continuous casting of six ingots, the gap between adjacent stripe elements partly became 1.0 mm or more due to the wear of the cold crucible. In Comparative Example 2, the maximum value of the impurity concentrations in the outer surface layer of the cast ingot was 0.4 for Cu and 1.0 for Ni, with the value of Comparative Example 1 being set as a reference (1.0).

In Inventive Example 1 using the copper-made cold crucible with Ni—B alloy plating on the inner surface, the gap between adjacent strip elements partly became 1.0 mm or more due to the wear of the cold crucible upon completion of continuous casting of twenty ingots. No peel-off of the Ni—B plating was discerned in the observation of the inner surface condition of the cold crucible which was performed upon completion of the continuous casting of twenty ingots.

In Inventive Example 1, the maximum value of the Cu concentration in the outer surface layer of the cast ingot was less than 0.1, which was remarkably lower than those in Comparative Examples 1 and 2. Thus, it could be confirmed that the continuous casting method of a silicon ingot of the present invention can reduce the contamination of the ingot as being cast with impurities, which is attributed to the contact with the inner surface of the cold crucible exposed by the peel-off of a silicon coating. Further, in Inventive Example 1, the maximum value of the Ni concentration in the outer surface layer of the cast ingot was 1.0, which was almost equal to those in Comparative Examples 1 and 2. Thus, it could be confirmed that contamination with Ni—B alloy plating is never caused in the cast ingots.

It was clarified from the above that the continuous casting method of a silicon ingot of the present invention can reduce, by using a cold crucible with Ni—B alloy plating on the inner surface thereof; the damage to the inner surface of the cold crucible, in addition to the contamination of cast ingots with impurities.

INDUSTRIAL APPLICABILITY

The continuous casting method of a silicon ingot of the present invention can reduce, by using a cold crucible with Ni—B alloy plating on the inner surface thereof, the damage to the inner surface of the cold crucible, in addition to the contamination of cast ingots with impurities.

Consequently, the continuous casting method of a silicon ingot of the present invention, when applied to the production of a solar battery wafer, can significantly contribute to quality improvement of the solar battery, as well as improvement in production yield.

REFERENCE SIGNS LIST

1: Chamber
2: Shutter
3: Silicon ingot
3a: Outer surface of silicon ingot
4: Outlet port
5: Inert gas inlet
6: Outlet
7: Bottomless cold crucible
7a: Inner surface of cold crucible
7b: Ni—B alloy plating portion
8: Induction coil
9: After-heater
11: Raw material inlet tube
12: Silicon raw materials
13: Molten silicon
13a: Outer side surface of molten silicon
14: Plasma torch
15: Support stand
20: Silicon ingot
20a: Outer surface of silicon ingot
21: Silicon divisio-ingot
22: Sample sheet
23: Test piece

CITATION LIST

Patent Literature

[Patent Literature 1] Japanese Patent Application Publication No. 10-101319

Non Patent Literature

Figure 3:
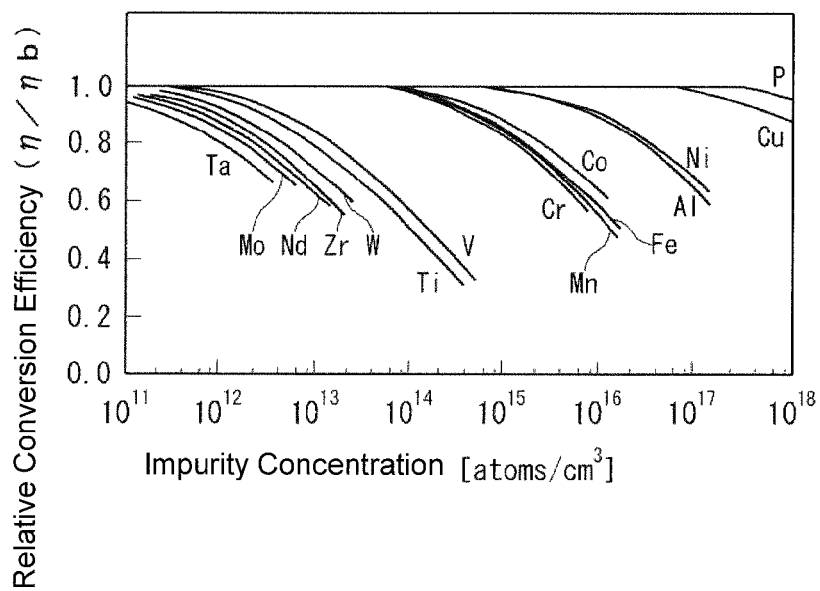
FIG. 3 is a view showing a relationship between impurity concentration and relative conversion efficiency in a monocrystalline silicon water.

[Non-Patent Literature 1] Revue Phys, Appl. 22 (1987), J. Fally, E. Fabre, B. Chabot, p. 532, FIG. 3

[Non-Patent Literature 2] Photovoltaic Engineering, Koichi Yamada and Hiroshi Komiyama, Nikkei BP (first published on Oct. 7, 2002), p. 85, FIG. 2-4-12

What is claimed is:

1. A continuous casting method of a silicon ingot for continuously casting the silicon ingot by arranging, inside an induction coil, a bottomless cold crucible having a part along an axial direction that is circumferentially divided into a plurality of strip elements, forming molten silicon inside the cold crucible through electromagnetic induction heating by the induction coil, and solidifying the molten silicon while pulling it down from the cold crucible, wherein
the cold crucible has a Ni—B alloy plating on a portion in the inner surface thereof that faces the outer side surface of the molten silicon and the outer surface of the silicon ingot.

* * * * *